United States Patent
Isogai et al.

(10) Patent No.: US 6,347,583 B1
(45) Date of Patent: Feb. 19, 2002

(54) SCREEN INSPECTING APPARATUS, AND SCREEN PRINTING MACHINE HAVING DEVICE FOR JUDGING IF OPENINGS ARE CLOGGED

(75) Inventors: Takeyoshi Isogai, Hekinan; Jun Adachi, Nagoya; Toshinori Shimizu, Kariya; Manabu Mizuno, Okazaki, all of (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/499,441

(22) Filed: Feb. 7, 2000

(30) Foreign Application Priority Data

Feb. 23, 1999 (JP) ............................................ 11-044682

(51) Int. Cl.⁷ .......................... B41L 13/02; G01N 21/88
(52) U.S. Cl. ....................... 101/126; 101/114; 101/123; 356/237.1; 348/131; 382/149; 382/112
(58) Field of Search .................... 101/114, 115, 101/123, 126, 127, 129, 425, 484; 427/8, 9, 10; 356/237.1; 250/559.4; 348/131, 125, 126, 127, 128, 129, 130; 362/246, 225; 382/141, 145, 144, 147, 149, 151, 152, 112

(56) References Cited

U.S. PATENT DOCUMENTS

| | | | | |
|---|---|---|---|---|
| 5,060,063 A | * | 10/1991 | Freeman | 358/101 |
| 5,165,336 A | * | 11/1992 | Spencer | 101/35 |
| 5,241,187 A | * | 8/1993 | Ikeda et al. | 101/114 |
| 5,568,964 A | | 10/1996 | Parker et al. | 362/32 |
| 5,740,729 A | | 4/1998 | Hikita et al. | 101/126 |
| 5,752,446 A | * | 5/1998 | Squibb | 101/126 |
| 5,912,984 A | * | 6/1999 | Michael et al. | 382/149 |

FOREIGN PATENT DOCUMENTS

| | | |
|---|---|---|
| DE | 42 17 430 A1 | 12/1993 |
| EP | 0 469 856 A2 | 2/1992 |
| JP | A-2-60748 | 3/1990 |
| JP | A-5-50578 | 3/1993 |
| JP | A-6-238867 | 8/1994 |
| WO | WO 97/43123 | 11/1997 |
| WO | WO 97/45268 | 12/1997 |
| WO | WO 98/42510 | 10/1998 |

* cited by examiner

Primary Examiner—Leslie J. Grohusky
(74) Attorney, Agent, or Firm—Oliff & Berridge, PLC

(57) ABSTRACT

An apparatus for inspecting a screen of a screen printing machine, including the steps of taking, with an image taking device, an image of at least one opening of the screen, and judging, based on image data representing the taken image, whether the opening of the screen is clogged.

7 Claims, 6 Drawing Sheets

SCREEN INSPECTING APPARATUS, AND SCREEN PRINTING MACHINE HAVING DEVICE FOR JUDGING IF OPENINGS ARE CLOGGED

BACKGROUND OF THE INVENTION

1. Field of the Invention

The present invention relates to a screen printing machine and particularly to the art of preventing a defective printing caused by clogging of the screen.

2. Related Art Statement

A screen printing machine is used in a wide range of art. For example, a screen printing machine is used for applying an adhesive or a solder paste to a printed wiring board ("PWB") before electric components are mounted on the PWB to produce one or more electric circuits on the PWB. This screen printing machine includes a screen which has a plurality of openings and on which a printing material such as an adhesive or a solder paste is placed, and a squeegee for forcing the printing material into the openings of the screen and thereby printing the material through the openings onto predetermined places on a PWB which is positioned below the screen. Thus, the printing material is printed on the PWB, at respective places thereon corresponding to the openings of the screen, and with respective shapes and volumes corresponding to respective shapes and capacities of the openings. However, if one or all of the openings of the screen is or are clogged (hereinafter, referred to simply as "the clogging of the screen"), only an insufficient amount of printing material or substantially no printing material is printed on the PWB.

In order to avoid the above-identified problem, a screen printing machine for printing a solder paste on a PWB has been used in such a way that an image taking device is employed to take an image of the solder paste printed on the PWB and image data representing the taken image is used to estimate about the clogging of the screen. If the clogging of the screen is estimated, or an early sign of the clogging is found, the screen is cleaned, or replaced with another screen. However, for some reasons, in particular, the reason that the color and lightness of surfaces of the PWB are near to those of the solder paste, it is not easy to take, with an image taking device, an image of the solder paste printed on the PWB. In addition, it is not easy to determine or measure the shape and/or size (three-dimensional, in particular) of the solder paste printed on the PWB. Moreover, there are some cases where the shape and/or size of the solder paste printed on the PWB may not accurately reflect the clogging of the screen. Thus, even though the screen is actually clogged, the clogging of the screen may be overlooked, which may result in producing one or more defective electric circuits on the PCB.

While the case where the solder paste is printed on the PWB has been described as an example, the above-identified problem may occur to not only the case where an adhesive is printed on a PWB but also the case where a printing material is printed on an object other than a PWB.

SUMMARY OF THE INVENTION.

The present invention provides a screen inspecting method, a screen inspecting apparatus, and a screen printing machine that have one or more of the technical features that are described below in respective paragraphs given parenthesized sequential numbers (1) to (11). Any technical feature that includes another technical feature shall do so by referring, at the beginning, to the parenthesized sequential number given to the latter technical feature. Thus, two or more of the following technical features may be combined, if appropriate. Each technical feature may be accompanied by a supplemental explanation, as needed. However, the following features and the appropriate combinations thereof are just examples to which the scope of the present invention is by no means limited.

(1) According to a first feature of the present invention, there is provided a method of inspecting a screen of a screen printing machine, comprising the steps of taking, with an image taking device, an image of at least one opening of the screen, and judging, based on image data representing the taken image, whether the opening of the screen is clogged. The image taking device may take an image or respective images of only one or more pre-selected openings of the screen. For example, the image taking device may be used to take an image of such an opening that is likely clogged or must be prevented from being clogged. Otherwise, the image taking device may take respective images of all the openings of the screen. In the latter case, the image taking device may take the respective images of all the openings, all at once, or alternatively may divide the openings into a plurality of groups and sequentially take respective images of the openings of each of the groups. In a special manner belonging to the alternative case, the image taking device is used to take sequentially an image of each of the openings. Respective images of openings of a single screen may be taken by a single image taking device or the cooperation of a plurality of image taking devices. In the case where the image taking device takes an image of an entire opening of the screen, it can be judged, based on image data representing the taken image, whether at least a portion of the opening of the screen is clogged with the printing material. In addition, the present screen inspecting method can be used, as needed, to identify which portion of an opening of the screen is clogged to which degree. Thus, in the case where the present method is carried out, as needed, during a printing operation in which a printing material is sequentially printed on each of a plurality of objects, the clogging of the screen or an early sign of the clogging can be detected, and an operator can take a necessary action, e.g., cleaning the screen or replacing the screen with another screens. Meanwhile, in the case where the present method is carried out each time printing on each object terminates, and if clogging is detected for an opening for which no clogging had been detected at the previous time, it can be estimated that a defective printing would have occurred to the previous object.

(2) According to a second feature of the present invention that includes the first feature (1), the step of taking the image comprises lighting the screen on one of both sides of the screen that is opposite to the other side on which the image taking device is provided, and taking a silhouette image of the opening. Since a silhouette image is not influenced by the color and/or lightness of the screen and/or the printing material, it can be accurately judged, based on image data representing the silhouette image, whether the opening of the screen is clogged. Since generally a solder paste is opaque, it is advantageous to take a silhouette image of the opening. In the last case, the screen may be a transparent one.

(3) According to a third feature of the present invention that includes the first or second feature (1) or (2), the step of judging comprises comparing the image data representing the taken image, with reference image data representing an image of the opening without clogging. It is easy to identify clogging of the opening, by comparing actual image data representing the taken image of the opening, with reference image data representing an image of the opening without clogging. In addition, which portion of the opening is clogged to which degree can be identified by comparing the shapes and size of the opening that are represented by the actual image data, with those represented by the reference image data. Moreover, irrespective of the shape of a portion of the opening through which a light passes, clogging of the opening can be identified by comparing the area of the opening represented by the actual image data, with that represented by the reference image data. In the last case, each of the actual image data and the reference image data may consist of only area data representing an area of the opening.

(4) According to a fourth feature of the present invention that includes any one of the first to third features (1) to (3), the step of taking the image comprises taking a first image of the opening before at least one printing of the screen printing machine, and taking a second image of the opening after the printing. Whether one or more printings of the screen printing machine has or have caused clogging of one or more openings of the screen can be identified by comparing the first image or images of the opening or openings before the printing or printings, with the second image or images of the opening or openings after the printing or printings. For example, image data representing an image of a screen which apparently has no clogged openings, e.g., a screen which has just been cleaned, or a new screen, may be employed as reference image data, and compared with actual image data representing an actual image of the screen taken after one or more printings. In this case, whether the printing or printings has or have caused clogging of one or more openings of the screen can be identified.

(5) According to a fifth feature of the present invention that includes any one of the first to third features (1) to (3), the step of taking the image comprises taking a first image of the opening before each of a plurality of printings of the screen printing machine, and taking a second image of the opening after said each printing. Since the image taking device takes a first image of the opening before each of a plurality of printings and a second image of the opening after the each printing, it can be judged whether the each printing is defective. If the first image indicates that the screen has no clogged openings but the second image indicates that the screen has one or more clogged openings, it can be estimated that a defective printing of the printing material would have occurred to the object.

(6) According to a sixth feature of the present invention, there is provided an apparatus for inspecting a screen of a screen printing machine, comprising an opening-image taking device which takes an image of at least one opening of the screen; and an image-data processing device which judges, based on image data representing the image taken by the opening-image taking device, whether the opening of the screen is clogged. The present screen inspecting apparatus can carry out the screen inspecting method according to the first feature (1). Each of the third to fifth features (3) to (5) may be employed by the present screen inspecting apparatus.

(7) According to a seventh feature of the present invention that includes the sixth feature (6), the screen inspecting apparatus further comprises a lighting device which lights the screen on one of both sides of the screen that is opposite to the other side on which the opening-image taking device is provided, so that the opening-image taking device takes a silhouette image of the opening.

(8) According to an eighth feature of the present invention that includes the sixth feature (6), the screen inspecting apparatus further comprises an opening-image-taking-device moving device which moves the opening-image taking device to an arbitrary position on a plane parallel to a plane of the screen. In this case, even if the opening-image taking device may be one whose field of view is considerably narrow, the present screen inspecting apparatus can reliably inspect clogging of a wide screen.

(9) According to a ninth feature of the present invention that includes the eighth feature (8), the screen inspecting apparatus further comprises a lighting plate which is provided on one of both sides of the screen that is opposite to the other side on which the opening-image taking device is provided, such that the lighting plate extends substantially parallel to the screen, and which emits, from a lighting surface thereof facing a substantially entire area of the screen, a light toward the screen, so that the opening-image taking device takes a silhouette image of the opening. The employment of the lighting plate according to this feature contributes to reducing the production cost of the present screen inspecting apparatus as a whole. However, in the case where the opening-image taking device is moved by an opening-image-taking-device moving device, a lighting-device moving device may be employed to move a lighting device such that the lighting device continues to be opposed to the opening-image taking device. In the latter case, the lighting device may be a small-size one.

(10) According to a tenth feature of the present invention, there is provided a screen printing machine, comprising a supporting device having a supporting surface on which an object is supported; a screen which extends parallel to the supporting surface of the supporting device and which has a plurality of openings; a squeegee which is slid on the screen to print a printing material placed on the screen, onto the object supported by the supporting device, through the openings of the screen; an elevating and lowering device which elevates and lowers one of the screen and the supporting device, so that said one of the screen and the supporting device is moved toward, and away from, the other of the screen and the supporting device; an opening-image taking device which takes an image of at least one of the openings of the screen; an opening-image-taking-device moving device which moves, in a space which is produced between the screen and the supporting device which are moved away from each other by the elevating and lowering device, the opening-image taking device to an arbitrary position on a plane parallel to a plane of the screen, so that the image taking device takes the image of said one opening of the screen; and an image-data processing device which judges, based on image data representing the image taken by the opening-image taking device, whether said one opening of the screen is clogged. The present screen printing machine has the function of inspecting clogging of the screen. The ninth feature (9) may be employed by the present screen printing machine.

(11) According to an eleventh feature of the present invention that includes the tenth feature (10), the screen printing machine further comprises a reference-mark-image taking device including a first image taking portion which takes respective images of a plurality of first reference marks provided on a lower surface of the screen, and a second image taking portion which takes respective images of a plurality of second reference marks provided on an upper surface of the object supported by the supporting device; a reference-mark-image-taking-device moving device which moves the reference-mark-image taking device to each of a plurality of positions where the reference-mark-image taking device is opposed to a corresponding one of the first reference marks and the second reference marks; and a positioning device which positions, based on image data representing the images taken by the reference-mark-image taking device, the object and the screen relative to each other in a direction parallel to the screen, and at least the first image taking portion of the reference-mark-image taking device is provided by the opening-image taking device. The reference-mark-image taking device and the reference-mark-image-taking-device moving device have been used in the art. In the case where at least a portion of the reference-mark-image taking device and the reference-mark-image-taking-device moving device is also used as at least a portion of the opening-image taking device and the opening-image-taking-device moving device, the present screen printing machine can enjoy the function of inspecting clogging of the screen while minimizing the increase of the production cost.

DETAILED DESCRIPTION OF THE PREFERRED EMBODIMENTS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, there will be described a screen printing machine as an embodiment of the present invention, by reference to the drawings. The screen printing machine prints a creamed solder as a printing material on a printed wiring board as an object.

The screen printing machine includes a printed-wiring-board ("PWB") conveyor (not shown) which conveys a printed wiring board ("PWB") 10 in an X-axis direction (i.e., a left-right direction as seen on the sheet of FIG. 1); a PWB positioning and supporting device 14 which positions and supports the PWB 10; a screen positioning and supporting device 16 which positions and supports a screen 44; and a squeegee device 18. The PWB conveyor, the PWB positioning and supporting device 14, the screen positioning and positioning device 16, and the squeegee device 18 are all provided on a common base (not shown).

Figure 1:
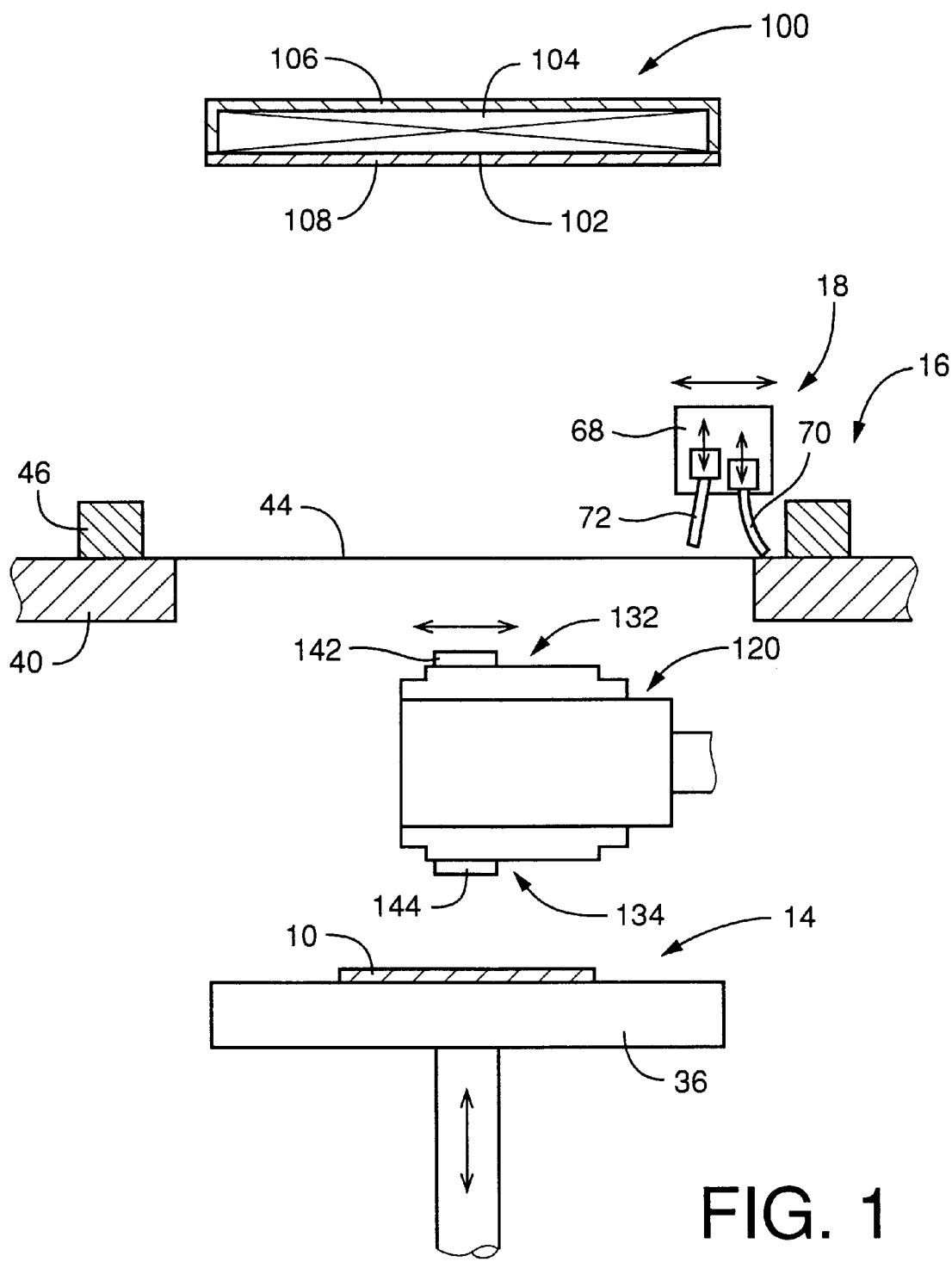
FIG. 1 is a partly cross-sectioned, front elevation view of a screen printing machine to which the present invention is applied.
Figure 6:
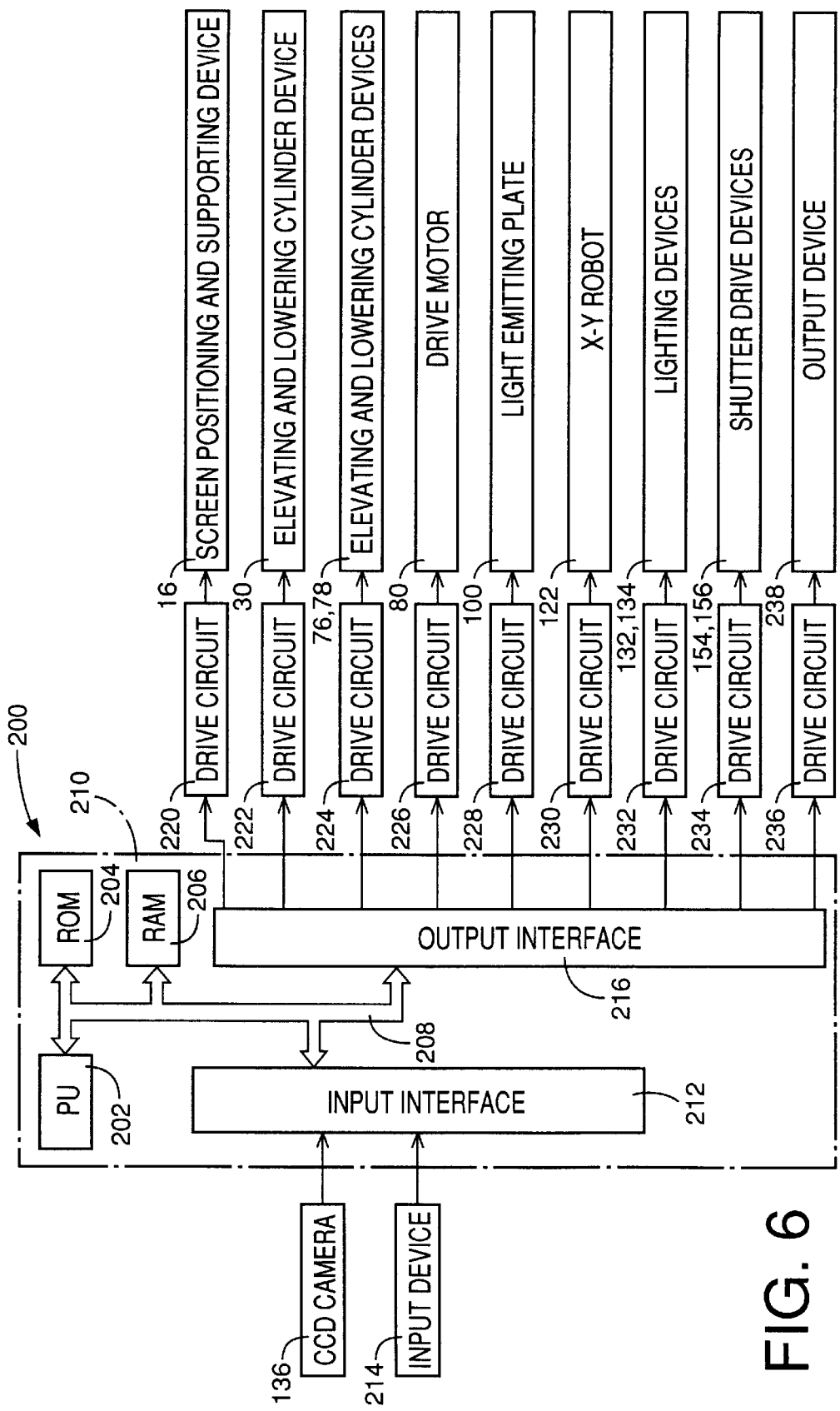
FIG. 6 is a diagrammatic view of a relevant portion of a control device of the screen printing machine of FIG. 1.

As shown in FIG. 1, the PWB positioning and supporting device 14 includes a PWB support table 36 which is elevated and lowered by an elevating and lowering cylinder device 30 (FIG. 6). The cylinder device 30 may be provided by a pressurized-fluid actuated cylinder device, such as a so-called "air cylinder". The cylinder device 30 is a multi-step cylinder device which can move and hold the PWB support table 36 to and at each of a plurality of height positions. The PWB 10 is conveyed by the PWB conveyor, is stopped by a stopper (not shown), and is positioned on the support table 36 by a positioning means such as one or more positioning pins. The PWB support table 36 cooperates with a PWB hold-down plate (not shown) provided above the support table 36, to sandwich the PWB 10, and in this state the support table 36 sucks and holds the PWB 10 by applying vacuum thereto and moves up to a predetermined printing position where the cream solder is printed on the PWB 10.

The screen positioning and supporting device 16 includes a screen support table 40 which supports a screen frame 46 to which an outer periphery of the screen,44 is fixed. The screen support table 40 is provided by a rectangular frame, and the screen frame 46 is placed on the support table 40. The screen support table 40 is positioned by an X-axis-direction positioning device (not shown) in the X-axis direction (i.e., the left-right direction as seen on the sheet of FIG. 1) parallel to the PWB-convey direction in which the PWB 10 is conveyed, and is positioned by a Y-axis-direction positioning device not shown) in a Y-axis direction perpendicular to the X-axis direction on a horizontal plane. The screen frame 46 is fixed to the support table 40 by a fixing device (not shown).

Figure 3:
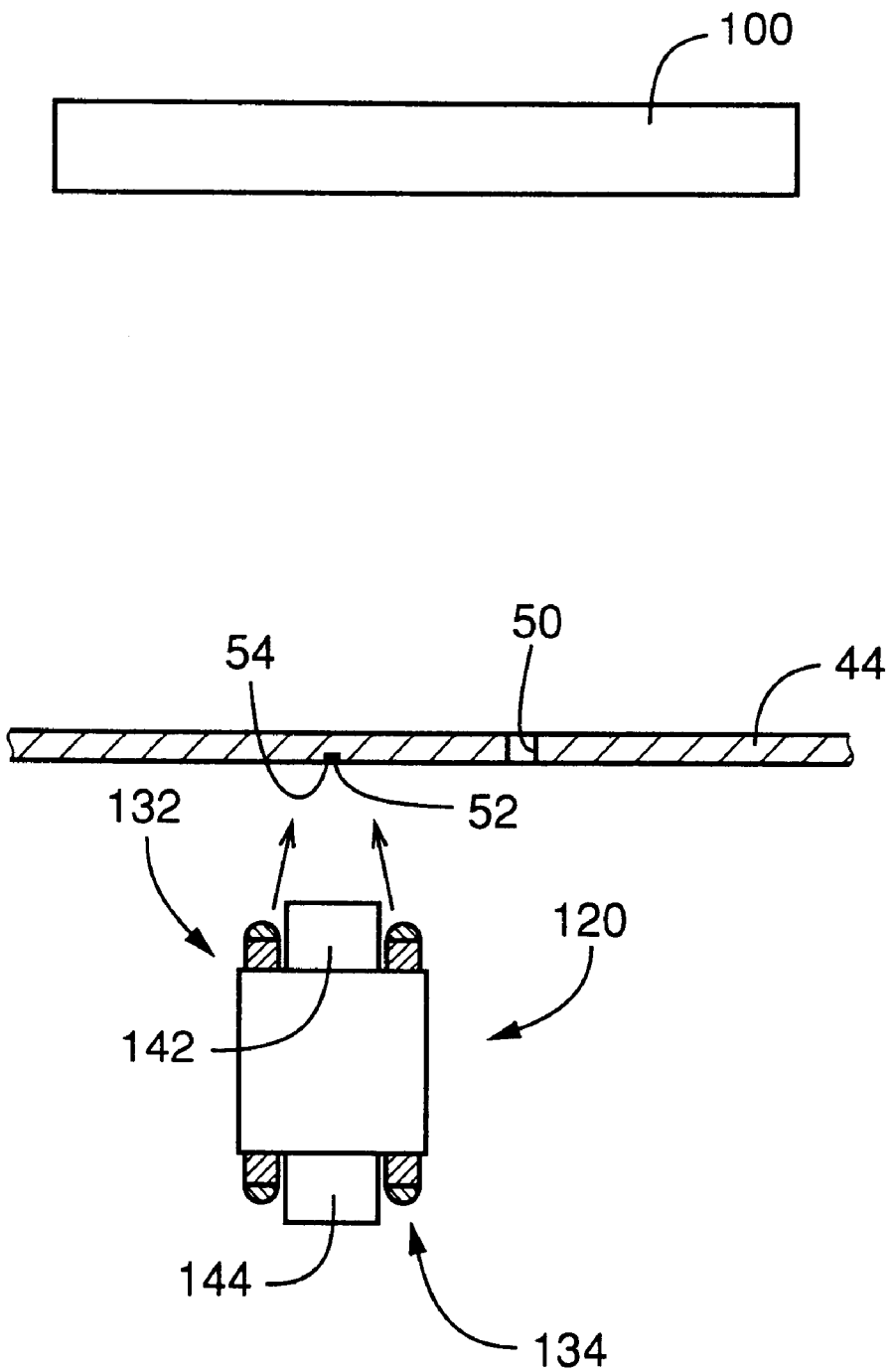
FIG. 3 is a view for explaining the manner in which the image taking device of FIG. 2 takes respective images of reference marks provided on a screen of the screen printing machine of FIG. 1.

As shown in FIG. 3, the screen 44 has a plurality of openings 50 (only one opening 50 is shown in FIG. 3) at respective positions corresponding to respective print positions predetermined on the PWB 10. Each of the openings 50 opens in each of upper and lower surfaces of the screen 44. The creamed solder is printed on the PWB 10 through the openings 50 of the screen 44. The screen 44 has the openings 50 at respective positions corresponding to, for example, respective positions where lead wires of flat-package-type electronic components are connected to the PWB 10, or electrodes of resistors or capacitors are connected to the PWB 10. The screen 44 has a plurality of reference marks 52 provided at respective positions which are, for example, on a diagonal line of the screen 44. In the present embodiment, each of the reference marks 52 is provided by a reference-mark hole 54 which is formed with a bottom in the lower surface of the screen 44, and a resin which has a color different from that of the material of the screen 44 and which fills the reference-mark hole 54. Meanwhile, the PWB 10 has a plurality of reference marks (not shown) at respective positions corresponding to the reference marks 52 of the screen 44.

The squeegee device 18 includes a slide 68 which is movable in the X-axis direction, and a first and a second squeegee 70, 72 which are supported by the slide 68 such that each of the two squeegees 70, 72 is movable up and down. A first and second elevating and lowering cylinder device 76, 78 (FIG. 6) elevates and lowers the first and second squeegees 70, 72, respectively, each to an operative position where each squeegee 70, 72 contacts the upper surface of the screen 44 and prints the creamed solder and an inoperative position where each squeegee 70, 72 is away from the screen 44. The slide 68 has a nut (not shown) which is threadedly engaged with a feed screw (not shown) and, when the feed screw is rotated in opposite directions by a drive motor 80 (FIG. 6), the slide 68 is moved by being guided by two guide rods (not shown), so that the two squeegees 70, 72 are reciprocatively moved linearly in the X-axis direction. One of the first and second squeegees 70, 72 is selectively used. The present screen printing machine carries out a screen printing operation, by moving the squeegee device 18 from one of opposite ends of the PWB 10 toward the other end of the same 10. An upstream-side one of the two squeegees 70, 72 as seen in the direction of movement of the squeegee device 18 is selected and used. Therefore, when the squeegee device 18 is moved from one of opposite ends of the PWB 10 toward the other end thereof, one of the two squeegees 70, 72 is selected and used; and when the squeegee device 18 is moved from the other end of the PWB 10 toward the one end thereof, the other of the two squeegees 70, 72 is selected and used. Thus, the present screen printing machine can carry out a bi-directional screen printing operation.

The base of the present machine additionally supports a rectangular light-emitting plate 100, above the squeegee device 18. The light emitting plate 100 is provided right above the screen 44 positioned by the screen support table 40, and extends over at least an area corresponding to an entire area in which the screen 44 has the openings 50. The light emitting plate 100 includes a light emitter 104 having a light emitting surface 102 facing downward; a support plate 106 which supports an opposite surface of the light emitter 104 that is opposite to the light emitting surface 102 thereof; and a diffusion plate 108 which covers the light emitting surface 102. In the present embodiment, the light emitter 104 is provided by a plurality of lamps, such as white fluorescent tubes, which are arranged in a parallel relation with each other. The light emitting plate 100 is connected to a drive circuit 228 (FIG. 6) via a lead wire (not shown) and, when the drive circuit 228 supplies electric current to the plate 100, the light emitter 104 emits, from the light emitting surface 102 thereof, respective lights in a downward direction, and the diffusion plate 106 diffuses the lights, so that a substantially uniform light is emitted toward the screen 44.

Between the screen support table 40 and the PWB support table 36, there is provided an image taking device 120 including two lighting devices 142, 144, such that the image taking device 120 rests on an X-Y robot 122 (FIG. 6) including an X-axis slide and a Y-axis slide and accordingly is movable in each of the X-axis and Y-axis directions. The image taking device 120 is moved with the X-Y robot 122 to two image-take positions between the screen support table 40 and the PWB support table 36, and to a retracted position retracted away from the image-take position. Before the image taking device 120 is moved to either one of the two image-take positions, the PWB support table 36 is moved downward to its lower-end position below the image-take positions. Thus, the image taking device 120 can be moved to the image-take positions, without being interfered with by the PWB support table 36.

Figure 2:
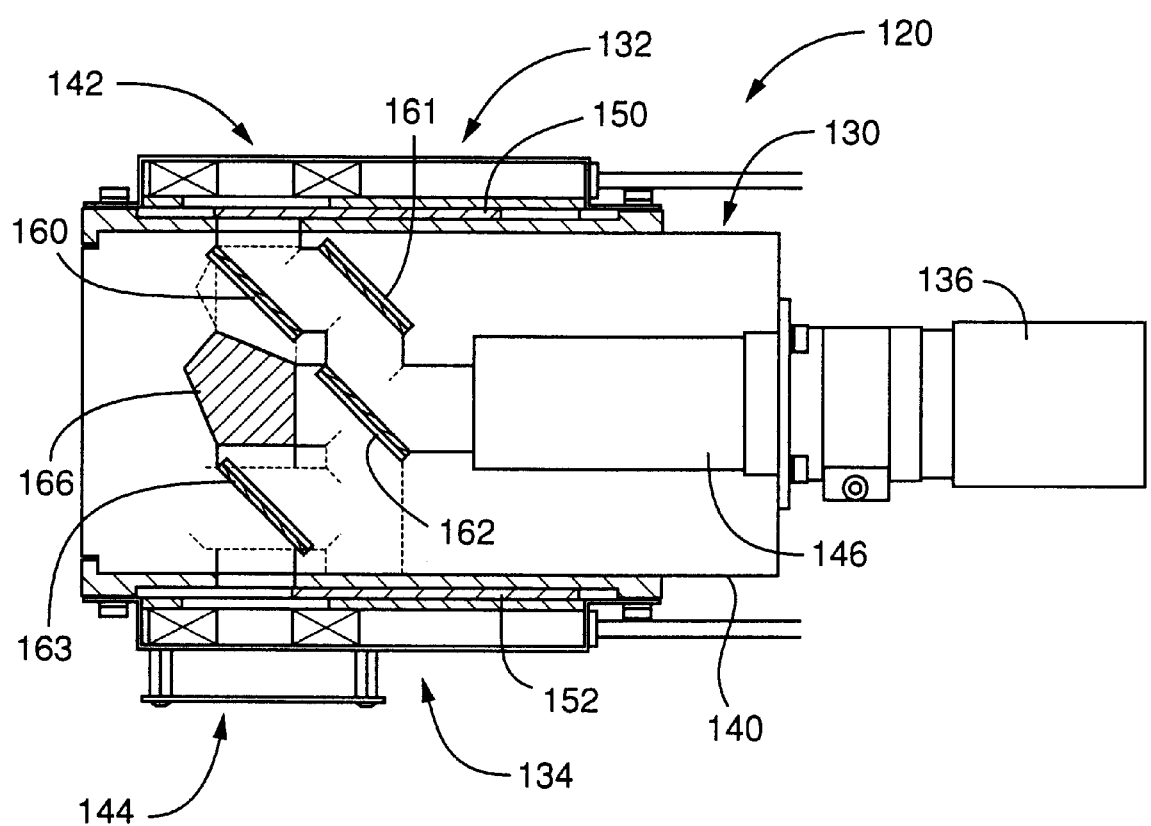
FIG. 2 is a partly cross-sectioned, front elevation view of an image taking device of the screen printing machine of FIG. 1.

As shown in FIG. 2, the image taking device 120 includes an optical system 130, the two lighting devices 132, 134, and a CCD camera 136. The optical system 130 includes a housing 140 which includes an upper image-intake portion 142 which opens in an upper wall of the housing 140 on the side of the screen support table 40, and a lower image-take portion 144 which opens in a lower wall of the housing 140 on the side of the PWB support table 36. The light taken by each of the two image-take portions 142, 144 is transmitted through an optical path provided in the housing 140, and is incident to a lens 146. The first lighting device 132 which emits a light toward the screen support table 40 is provided around the first image-take portion 142, and similarly the second lighting device 132 which emits a light toward the PWB support table 36 is provided around the second image-take portion 144. Each of the two lighting devices includes a light emitter which is provided by a plurality of light emitting diodes each of which emits a light including visible rays in a great proportion, and a PWB on which the diodes are arranged; and a diffusion plate which uniformly diffuses the respective lights emitted by the diodes of the light emitter. In the present embodiment, the CCD camera 136 is one which is sensitive to visible rays. The two image-take portions 142, 144 are associated with two shutters 150, 152, respectively, which are driven or moved by two shutter drive devices 154, 156 (FIG. 6), respectively, so that each of the two shutters 150, 152 opens and closes an opening of a corresponding one of the two image take portions 142, 144. The optical path provided in the housing 140 of the optical system 130 is defined by a mirror 160, three half mirrors 161, 162, 163, and a prism 166. Thus, the light which is emitted by each of the two lighting devices 132, 134 and is reflected by a corresponding one of the screen 44 and the PWB 10, is deflected by the mirrors 160, 161, 162, 163 and the prism 166, so as to be incident to the lens 146. Although not shown, each of the lighting devices 132, 134 includes an auxiliary lighting portion which is provided in the housing 140. The light emitted by the auxiliary lighting portion of the upper lighting device 132 is transmitted through the half mirror 161 and then is reflected by the mirror 160, so as to light the screen 44; and the light emitted by the auxiliary lighting portion of the upper lighting device 132 is reflected by the half mirror 163, so as to light the PWB 10.

In the present embodiment, the image taking device 120 takes not only respective images of the reference marks 52 of the screen 44 and the reference marks of the PWB 10, for detecting a position error between the screen 44 and the PWB 10, but also respective images of the openings 50 of the screen 44, for inspecting clogging of the screen 44.

The present screen printing machine additionally includes a screen storing device which stores a plurality of screens 44; a screen transferring device which transfers each screen 44 between the screen positioning and supporting device 16 and the screen storing device, for exchanging the current screen 44 with another screen 44, as needed, for example, when the current sort of PWBs 10 are changed to another sort of PWBs 10; and a screen cleaning device which cleans the screen 44. However, those devices are described in detail in Japanese Patent Application laid open under Publication No. 6 (1994)-238867, and are not relevant to the present invention. Accordingly, the description of those devices is omitted.

The present screen printing machine includes a control device 200 shown in FIG. 6. The control device 200 is essentially provided by a computer 210 including a processing unit ("PU") 202, a read only memory ("ROM") 204, a random access memory ("RAM") 206, and a bus 208 for connecting the elements 202, 204, 206 to one another. An input interface 212 is connected to the bus 208, and the CCD camera 136 and an input device 214 are connected to the input interface 214. The input device 214 includes a keyboard or a panel which is manually operable by an operator.

In addition, the bus 208 is connected to an output interface 216 which is connected via respective drive circuits 220, 222, 224, 226, 228, 230, 232, 234, 236 to the screen positioning and supporting device 16, the table elevating and lowering cylinder device 30, the two squeegee elevating and lowering cylinder devices 76, 78, the drive motor 80, the light emitting plate 100, the X-Y robot 122, the two lighting devices 132, 134, the two shutter drive devices 154, 156, and an output device 238 including a display. Although other elements such as an electric motor which drives the PWB conveyor are additionally connected to the control device 200, only the elements relevant to the present invention are shown in FIG. 6. The control device 200 includes an image processing portion which processes the images taken by the CCD camera 136, detects a relative-position error between the PWB 10 and the screen 44, and inspects clogging of the openings 50 of the screen 44. The ROM 204 stores various control programs which are needed to carry out the position-error detecting operation and the opening-clogging inspecting operation.

Next, there will be described the operation of the screen printing machine constructed as described above.

Before a screen printing operation is started, the screen 44 is positioned on the screen support table 44 and the PWB 10 is positioned on the PWB support table 36, and in this state respective images of the reference marks 52 of the screen 44 and the reference marks of the PWB 10 are taken by the image taking device 120. When an image of each of the reference marks of the PWB 10 is taken, the lower image-take portion 144 of the image taking device 120 is moved by the X-Y robot 122 to a position right above the each reference mark, the corresponding, lower shutter 152 is opened, the opposite, upper shutter 150 is closed, and the lighting device 134 is turned on. Thus, a visible light is emitted toward an exposed, upper surface of the PWB 10 that bears the each reference mark, and the light reflected from the upper surface is incident to the lower image-take portion 144, so that the light is transmitted, via the half mirror 163, the prism 166, and the half mirror 162, to the lens 146, which forms an exposed image of the each reference mark (i.e., an image of the exposed upper surface of the PWB 10) on the CCD camera 136.

When an image of each of the reference marks 52 of the screen 44 is taken, the upper image-take portion 142 of the image taking device 120 is moved by the X-Y robot 122 to a position right below the each reference mark 52, as shown in FIG. 3, the corresponding, upper shutter 150 is opened, the opposite, lower shutter 152 is closed, and the lighting device 132 is turned on. Thus, a visible light is emitted toward an exposed, lower surface of the screen 44 that bears the each reference mark 52, and the light reflected from the lower surface is incident to the upper image-take portion 142, so that the light is transmitted, via the mirror 160 and the half mirrors 161, 162, to the lens 146, which forms an exposed image of the each reference mark 52 (i.e., an image of the exposed lower surface of the screen 44) on the CCD camera 136.

Two batches of image data representing the respective exposed images of the two reference marks of the PWB 10 that have been taken by the CCD camera 136, and two batches of image data representing the respective exposed images of the two reference marks 52 of the screen 44 that have been taken by the CCD camera 136, or four batches of binary-coded image data corresponding to the four batches of raw image data are supplied to the image processing portion of the control device 200, which determines an error of relative position between the reference marks of the PWB 10 and those 52 of the screen 44. The control device 200 controls, based on the thus determined relative-position error, the X-axis-direction positioning device and the Y-axis-direction positioning device of the screen positioning and supporting device 16, to change the position of the screen 44, so that the two reference marks 52 of the screen 52 are aligned with the two reference marks of the PWB 10, respectively. In this state, the screen 44 is fixed to the screen support table 44 by the fixing device of the screen positioning and supporting device 16.

Figure 4:
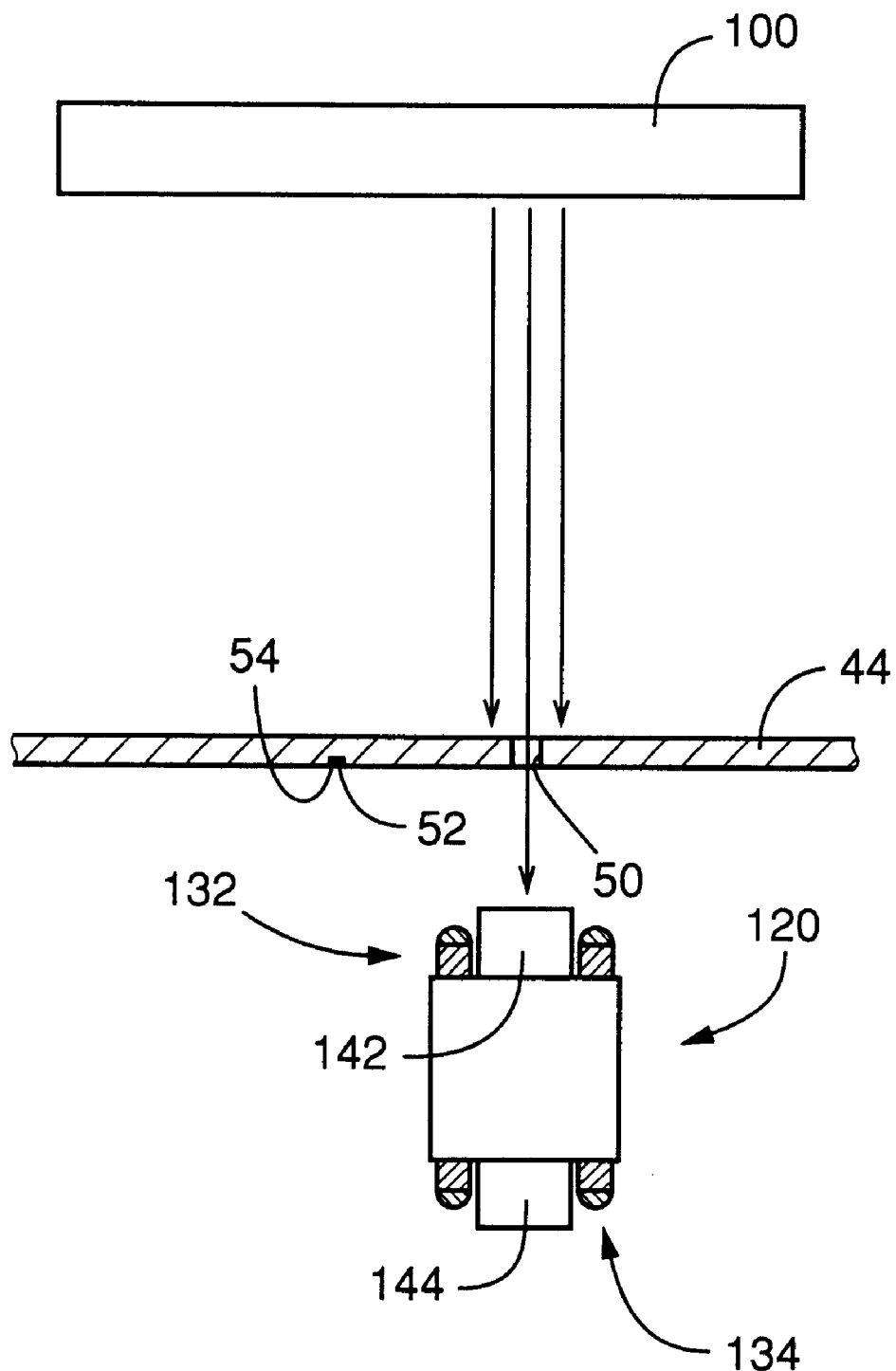
FIG. 4 is a view for explaining the manner in which the image taking device of FIG. 2 takes an image of an opening of the screen.

Subsequently, the control device 200 controls the image taking device 120 to take an image of one or more openings 50 of the screen 44. As shown in FIG. 4, the upper image-take portion 144 of the image taking device 120 is moved to a position right below a portion of the screen 44 that bears a plurality of openings 50, the corresponding, upper shutter 150 is opened, the opposite, lower shutter 152 is closed, and the light emitting plate 100 is turned on. Thus, the openings 50, and their vicinities, of the screen 44 are uniformly lighted by the light emitting plate 100 provided on one side of the screen 44 that is opposite to the other side thereof on which the image taking device 120 is provided. The light passing through the openings 50 is incident to the upper image-take portion 142, so that the light is transmitted, via the mirror 160 and the half mirrors 161, 162, to the lens 146, which forms a silhouette image of the openings 50 on a matrix of solid-state imaging elements of the CCD camera 136. Light portions of the silhouette image correspond to the openings 50 which transmit the light, and dark portions of the silhouette image correspond to the openings 50 which do not transmit the light.

Since the current screen 44 has not been used yet, the screen 44 does not have any clogged openings 50. A batch of image data representing the thus taken images of the openings 50 of the screen 44 is stored as a batch of reference image data in the RAM 206 in such a manner that the batch of reference image data is associated with a batch of position data representing the respective positions of the openings 50. In the present embodiment, the image taking device 120 takes, all at once, respective images of a plurality of openings 50 located in one of a plurality of divided areas of the screen 44. While the image taking device 120 is moved with the X-Y robot 122, the image taking device 120 sequentially takes respective images of openings 50 located in each of the divided areas of the screen 44. After all, the image taking device 120 takes respective images of all the openings 50 of the screen 44. Since the divided areas of the screen 44 partly overlap each other, the image taking device 120 can reliably take respective images of all the openings 50 of the screen 44. Alternatively, the control device 200 may be adapted to control the image taking device 120 to take, at each time, an image of one of the openings 50. However, it is not essentially needed to take respective images of all the openings 50 of the screen 44. For example, it is possible that the image taking device 120 be controlled to take an image or images of only one or more openings 50 which belongs or belong to a designated area of the screen 44 in which the opening or openings 50 is or are highly liable to clogging.

After the screen 44 and the PWB 10 are accurately positioned and held relative to each other and the images of the non-clogged openings 50 of the screen 44 are taken by the image taking device 120, the screen printing operation is started. A creamed solder which has been kneaded to an appropriate degree of viscosity is placed on the screen 44, the slide 68 of the squeegee device 18 is positioned, as shown in FIG. 1, at one of opposite ends of the printing area of the screen 44 as seen in the X-axis direction, and one of the first and second squeegees 70, 72 is held at its upper-end position and the other squeegee is held at its lower-end position. In this state, the image taking device 120 is moved by the X-Y robot 122 from its image-take positions between the screen support table 40 and the PWB support table 36, to its retracted position away from the two tables 40, 36, and the PWB support table 36 is moved by the elevating and lowering cylinder device 30 to its print position where the PWB 10 is held in close contact with the lower surface of the screen 44. Then, the slide 68 is moved and the creamed solder is printed on the PWB 10 through the openings 50 of the screen 44.

Figure 5:
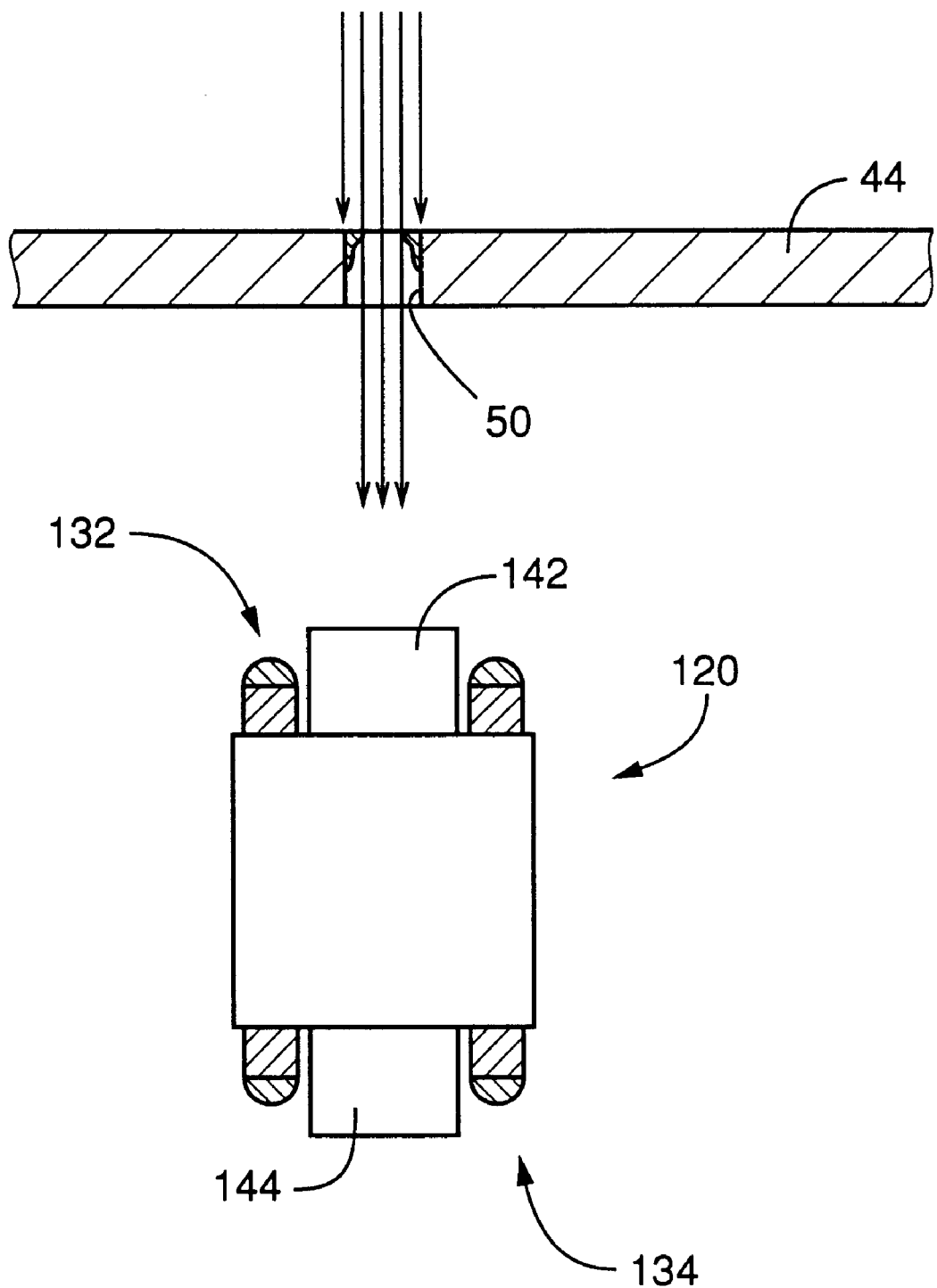
FIG. 5 is a view showing that the image taking device of FIG. 2 takes an image of a clogged opening of the screen.

After the screen printing on the PWB 10 ends, the PWB support table 26 is moved down, and the image taking device 120 is moved, as shown in FIG. 4, to each of the two image-take positions where the image taking device 120 takes respective images of the openings 50 of the screen 44 in the same manner in which the image taking device 120 had taken the respective images of the openings 50 before the screen printing. A batch of actual image data representing the respective silhouette images of the openings 50 taken by the CCD camera 136 is supplied to the image processing portion of the control device 200, which processes the batch of actual image data, compares the thus processed actual image data with the reference image data stored in the RAM 206, and judges whether each of the openings 50 that have been used in the screen printing is clogged. One or more openings 50 which remains or remain non-clogged corresponds or correspond to one or more light or bright portions of a silhouette image represented by the actual image data, but one or more openings 50 which is or are clogged turns or turn dark in the silhouette image, because a clogged portion of the opening or openings 50 does not transmit the light, as shown in FIG. 5. Therefore, clogging of the screen 44 can be easily identified by comparing the area of the light (or dark) portions of the actual silhouette image represented by the actual image data, with that of the reference silhouette image represented by the reference image data. For example, the control device 200 judges that the screen 44 is not clogged, if the ratio of the area of the light portions of the actual silhouette image to that of the reference silhouette image is greater than a threshold value, and judges that the screen 44 is clogged, if not. In addition, the control device 200 identifies which portion of which opening 50 is clogged to which degree, by comparing the shape and size of the light (or dark) portions of the actual silhouette image to those of the reference silhouette image. If the control device 200 judges that the screen 44 is clogged with the creamed solder, the control device 200 automatically operates the screen conveying device to exchange the current screen 44 with another screen 44 stored in the screen storing device, or the screen cleaning device to clean the current screen 44.

In the present embodiment, each time a screen printing ends on one PWB 10, the clogging of the screen 44 is inspected in the above-described manner. If the clogging of the screen 44 is found after a screen printing though the clogging is not found before the screen printing, the control device 200 estimates that the screen printing would be defective.

It emerges from the foregoing description that in the illustrated embodiment an actual silhouette image of the openings 50 of the screen 44 is taken and is compared with a reference silhouette image of the openings 50 that is stored in advance in the RAM 206, and it is judged whether the screen 44 is clogged. Thus, the clogging of the screen 44 can be easily and accurately inspected. When the control device 44 identifies based on the taken silhouette image that the screen 44 is not clogged, or after the control device 200 operates, when identifying that the screen 44 is clogged, controls the screen printing machine to exchange the clogged screen 44 with another screen 44 or clean the clogged screen 44, the screen printing machine starts another screen printing on another PWB 10. Thus, the present printing machine can effectively avoid a defective printing caused by clogging of the screen 44. In addition, since the image taking device 120 is used for not only taking the images of the openings 50 but also taking the images of the reference marks of the PWB 10 and the reference marks 52 of the screen 44, the present screen printing machine can be produced at reduced cost.

In the illustrated embodiment, the elevating and lowering cylinder device 30 is employed as a sort of elevating and lowering device. Therefore, the cylinder device 30 may be replaced with the combination of an electric motor, a feed screw, and a nut. The light emitting plate 100 is employed as a sort of lighting device, and the light emitter 104 as part of the lighting device may be provided by a plurality of light emitting diodes which are arranged on respective lattice points on a PWB. Otherwise, the light emitter 104 may be replaced with a reflecting plate having a reflecting surface for reflecting a light so that the reflected light lights the upper (i.e., back) surface of the screen 44 and the image taking device 120 takes a silhouette image of the screen 44. The lighting device may be of a size which can light an area including just one opening 50. In this case, a moving device is employed to move the lighting device to a position where the lighting device is opposed to the image taking device 120. The image taking device 120 including the CCD camera 136 is employed as a sort of image taking device, and the X-Y robot 122 is employed as a sort of image-taking-device moving device.

In the illustrated embodiment, the clogging of the screen 44 is inspected each time a screen printing is effected on one PWB 10. However, it is possible that the clogging of the screen 44 be inspected each time a predetermined number of screen printings are continuously effected on the same number of PWBs 10. In addition, the present screen printing machine may employ, as an image taking device which takes an image of at least one opening 50 of the screen 44, one which is separate from an image taking device which takes an image of at least one reference mark of the screen 44 or each PWB 10.

While the present invention has been described in its preferred embodiments, it is to be understood that the present invention may be embodied with, in addition to the first to eleventh features (1) to (11) described in SUMMARY OF THE INVENTION, other changes, improvements, and modifications that may occur to a person skilled in the art without departing from the scope and spirit of the invention defined in the appended claims.

What is claimed is:

1. An apparatus for inspecting a screen of a screen printing machine, comprising:

an opening-image taking device which takes an image of at least one opening of the screen and is provided in a plane parallel to a plane of the screen;

a lighting plate which is provided on one of opposite sides of the screen that is opposite to the other side on which the opening-image taking device is provided, such that the lighting plate extends substantially parallel to the screen, and which emits, from a lighting surface thereof facing a substantially entire area of the screen, a light toward the screen, so that the opening-image taking device takes a silhouette image of said at least one opening of the screen;

an opening-image-taking-device moving device which moves the opening-image taking device to an arbitrary position in the plane parallel to the plane of the screen, so that the opening-image taking device takes the silhouette image of said at least one opening of the screen; and an image-data processing device which judges, based on the image taken by the opening-image taking device, whether said at least one opening of the screen is at least partly clogged.

2. An apparatus according to claim 1, wherein the lighting plate comprises a light emitter which has the lighting surface facing the substantially entire area of the screen and emits the light from the lighting surface;

and a diffusion plate which covers the lighting surface and diffuses the light emitted from the lighting surface, so that a substantially uniform light is emitted toward the screen.

3. An apparatus according to claim 2, wherein the light emitter comprises a plurality of light sources which are arranged along the lighting surface.

4. An apparatus according to claim 3, wherein the light sources comprise a plurality of light-emitting tubes which extend parallel to each other along the lighting surface.

5. An apparatus according to claim 1, wherein the lighting plate has a rectangular shape substantially corresponding to the screen.

6. A screen printing machine, comprising:

a supporting device having a supporting surface which is adapted to support an object;

a screen which extends parallel to the supporting surface of the supporting device and which has a plurality of openings;

a squeegee which is slid on the screen adapted to print a printing material placed on the screen, onto the object supported by the supporting device, through the openings of the screen;

an elevating and lowering device which elevates and lowers one of the screen and the supporting device, so that said one of the screen and the supporting device is moved toward, and away from, the other of the screen and the supporting device;

an opening-image taking device which takes an image of at least one of the openings of the screen;

a lighting plate which is provided on one of opposite sides of the screen that is opposite to the other side on which the opening-image taking device is provided, such that the lighting plate extends substantially parallel to the screen, and which emits, from a lighting surface thereof facing a substantially entire area of the screen, a light toward the screen, so that the opening-image taking device takes a silhouette image of said at least one opening of the screen;

an opening-image-taking-device moving device which moves, in a space which is produced between the screen and the supporting device which are moved away from each other by the elevating and lowering device, the opening-image taking device to an arbitrary position on a plane parallel to a plane of the screen, so that the opening-image taking device takes the silhouette image of said at least one opening of the screen; and an image-data processing device which judges, based on the image taken by the opening-image taking device, whether said one at least opening of the screen is at least partly clogged.

7. A machine according to claim 6, further comprising:

a reference-mark-image taking device including a first image taking portion which takes respective images of a plurality of first reference marks provided on a lower surface of the screen, and a second image taking portion which takes respective images of a plurality of second reference marks provided on an upper surface of the object supported by the supporting device;

a reference-mark-image-taking-device moving device which moves the reference-mark-image taking device to each of a plurality of positions where the reference-mark-image taking device is opposed to a corresponding one of the first reference marks and the second reference marks; and a positioning device which positions, based on the images taken by the reference-mark-image taking device, the object and the screen relative to each other in a direction parallel to the screen, wherein at least the first image taking portion of the reference-mark-image taking device is provided by the opening-image taking device and the reference-mark-image-taking-device moving device is provided by the opening-image-taking-device moving device.

* * * * *